US006049134A

United States Patent [19]

Michael et al.

[11] Patent Number: 6,049,134

[45] Date of Patent: Apr. 11, 2000

[54] MASK GENERATION TECHNIQUE FOR PRODUCING AN INTEGRATED CIRCUIT WITH OPTIMAL METAL INTERCONNECT LAYOUT FOR ACHIEVING GLOBAL PLANARIZATION

[75] Inventors: Mark W. Michael, Cedar Park; Robert Dawson, Austin; Fred N. Hause, Austin; Basab Bandyopadhyay, Austin; H. Jim Fulford, Jr., Austin; William S. Brennan, Austin, all of Tex.

[73] Assignee: Advanced Micro Devices, Inc., Sunnyvale, Calif.

[21] Appl. No.: 09/015,821

[22] Filed: Jan. 29, 1998

Related U.S. Application Data

[62] Division of application No. 08/659,165, Jun. 5, 1996, Pat. No. 5,766,803.

[51] Int. Cl.[7] .......................... H01L 29/72; H01L 21/283

[52] U.S. Cl. .......................... 257/774; 257/758; 257/734; 257/754; 257/773

[58] Field of Search .................................... 257/758, 734, 257/774, 754, 773

[56] References Cited

U.S. PATENT DOCUMENTS

| | | | |
|---|---|---|---|
| 4,916,514 | 4/1990 | Nowak | 257/758 |
| 5,028,981 | 7/1991 | Eguchi | 257/754 |
| 5,357,140 | 10/1994 | Kozasa | 257/758 |
| 5,441,915 | 8/1995 | Lee | 257/211 |
| 5,597,668 | 1/1997 | Nowak et al. | 430/311 |
| 5,698,902 | 12/1997 | Uehara et al. | 257/647 |
| 5,773,857 | 6/1998 | Ura | 257/211 |
| 5,905,289 | 5/1998 | Lee | 257/773 |

*Primary Examiner*—Wael Fahmy
*Assistant Examiner*—Hung Van Duong
*Attorney, Agent, or Firm*—Kevin L. Daffer; Conley, Rose & Tayon

[57] ABSTRACT

A photolithography mask derivation process is provided for improving the overall planarity of interlevel dielectric deposited upon conductors formed by the derived photolithography mask. The photolithography mask is derived such that non-operational conductors are spaced a minimum distance from each other and from operational conductors to present a regular spaced arrangement of conductors upon which a dielectric layer can be deposited and readily planarized using, for example, chemical-mechanical polishing techniques. The resulting interlevel dielectric upper surface is globally planarized to an even elevational level across the entire semiconductor topography. The operational conductors are dissimilar from non-operational conductors in that the operational conductors are connected within a circuit path of an operational integrated circuit. Non-operational conductors are not connected within the integrated circuit path and generally are floating or are connected to a power supply. The non-operational conductors thereby do not contribute to the integrated circuit functionality other than to provide structural planarity to the overlying interlevel dielectric. The mask derivation process is applicable to either a metal interconnect photolithography mask or a polysilicon interconnect photolithography mask.

15 Claims, 4 Drawing Sheets

+

=

MASK GENERATION TECHNIQUE FOR PRODUCING AN INTEGRATED CIRCUIT WITH OPTIMAL METAL INTERCONNECT LAYOUT FOR ACHIEVING GLOBAL PLANARIZATION

This application is a division of Ser. No. 08/659,165 filed Jun. 5, 1996 now U.S. Pat. No. 5,766,803.

BACKGROUND OF THE INVENTION

1. Field of the Invention

This invention relates to semiconductor fabrication and more particularly to a mask generation technique for forming regularly spaced interconnect necessary for optimal planarization. The mask generation technique is applicable to the production of a mask which can produce interconnect on the first or subsequent interconnect levels, upon which a dielectric is placed and thereafter globally planarized through etchback or polish.

2. Description of the Relevant Art

Fabrication of an integrated circuit involves placing numerous devices on a single monolithic substrate. Each device is electrically isolated from the others, but later in the fabrication sequence specific devices are electrically interconnected so as to implement desired circuit function. Interconnect of those devices often takes place on more than one elevational level, each level having a set of substantially coplanar interconnect conductors. The numerous levels of interconnect arranged above a monolithic substrate is generally referred to as a multilevel interconnect structure.

There are numerous challenges involved with producing a multilevel interconnected structure. One of the more complex problems involves planarizing the interlevel dielectric layers formed on each level of interconnect. There are typically two types of interlevel dielectrics: a metal interlevel dielectric and a polysilicon interlevel dielectric. The metal interlevel dielectric is formed upon metal interconnect, either the first, second or subsequent layers of metal within the multilevel interconnect structure. The polysilicon interlevel dielectric is formed only upon polysilicon interconnect, generally the first level of interconnect. Polysilicon is herein defined as gate polysilicon, local interconnect polysilicon or a polysilicon dielectric interposed between a pair of capacitor plates.

Planarization of an interlevel dielectric, whether a metal interlevel dielectric or a polysilicon interlevel dielectric, is a matter of degree. There are several types of planarization techniques ranging from minimal planarization (i.e., smoothing); intermediate planarization, involving only isolated or local planarization; or extensive planarization, involving global planarization. Smoothing entails merely lessening the step slopes at the dielectric surface while not significantly reducing the surface elevational disparity. On the other hand, local planarization substantially reduces if not eliminates entirely the elevational disparity in localized areas across the substrate. Global planarization, however, is designed for eliminating elevational disparity over the entire topography of the integrated circuit and wafer. As one can imagine, global planarization is extremely difficult to achieve on a multilevel interconnect structure having, for example, two or more levels of interconnect.

Most manufacturers have quantified the level of planarization, and have attributed a planarization factor generally described as "total indicated range" or TIR. If the degree of planarization is small, or the TIR is large, then subsequent interconnect placed on the interlevel dielectric surface suffer from poor step coverage and generally cannot be accurately patterned due to depth-of-field limitations. Poor planarization also can result in the formation of narrow crevices in the dielectric which lead to residual metal "stringers" left in the crevices after metal etch. Even though local planarization is achieved, absent global planarization, step coverage and depth-of-field limitations present themselves at the local/global juncture. For example, if a submicron interconnect feature is to be patterned, the TIR, demonstrated as elevational disparity, must be less than 0.5 microns. Absent global planarization, such features cannot be readily obtained. In order to attempt global planarization, conventional planarization processes involve, inter alia, at least four separate types of planarization. First, limited planarization is achieved through a sacrificial etchback technique. Sacrificial etchback involves depositing a sacrificial layer across the interlevel dielectric topography, and then removing a sacrificial layer at the same etch rate as the underlying dielectric. The sacrificial etchback technique is well documented, and is generally valid only for the planarization of dielectric topographies in which the underlying features are 3.0 to 10.0 microns apart. For large regions between trenches, the step height will not be reduced, since the sacrificial material on top of such features will be the same as the thickness over the adjacent trench. In an effort to overcome the shortcomings of sacrificial etchback, a planarization block masking technique is often used. In this procedure, a liquid material is applied and developed as a planarization film followed by a block mask used to expose and develop this film. The block mask is arranged to protect topography in wide low regions from subsequent etch material. Thus, the planarization block mask allows removal of elevationally high regions commensurate with the protected low regions. Unfortunately, the planarization block mask involves an additional lithography step and a mask which must be produced and aligned with the underlying topography. Another planarization technique involves deposition of a planarization layer, followed by etchback, followed by another deposition. Thus, an oxide can be deposited, etched and then additional oxide placed in a deposit-etch-deposit sequence, all of which can be repeated as necessary. One problem involving deposit-etch-deposit is the very low throughput involved in depositing, etching and then redepositing within, e.g., a CVD/etch tool.

A more recent planarization process called chemical-mechanical polishing ("CMP"), overcomes to some extent the limitations of sacrificial etchback and block masking. CMP involves the application of a slurry and an abrasive pad across the entire topography. CMP forces planarization of that topography commensurate with the planarity of the pad surface. Provided the pad surface is relatively flat, the surface would be translated to the interlevel dielectric surface. Unfortunately, however, when force is applied to the pad, the pad will oftentimes conform to the unevenness of that topography. Thus, while high elevational areas (or peaks) receive substantial polishing, low elevational areas (or valleys) are also slightly abraded and removed.

A better understanding of the problems inherent with CMP are illustrated in reference to FIGS. 1 and 2. FIG. 1 depicts a partial cross-section of a semiconductor topography 10. Topography 10 includes a substrate 12 having a level of interconnect 14 fashioned thereon. Interconnect 14 comprises a plurality of substantially coplanar conductors 14*a*, 14*b*, and 14*c*. A relatively small lateral space 16*a* is formed between conductors 14*a* and 14*b*, and a relatively large lateral space 16*b* is formed between conductors 14*b* and 14*c*. Spaces 16 causes a disparity in the upper surface of a subsequently deposited interlevel dielectric 18. Accordingly, dielectric 18 must be planarized in a subsequent processing step shown in FIG. 2.

FIG. 2 illustrates a planarization technique using, for example, CMP. Specifically, the upper surface of interlevel dielectric 18 receives the slurry and polishing pad. The polishing pad inherently flexes or conforms under pressure to the upper surface of dielectric 18, causing the polishing pad to attack and remove dielectric 18 upper surface in large space areas **16*b*. Accordingly, an upper surface which has large valley areas will retain those valley areas after CMP. An upper surface having, on the other hand, numerous small valley areas will be more optimally planarized in accordance with that shown herein below. It would be desirable, therefore, to reduce to zero the elevational disparity 20, shown in FIG. 2**.

While a need exists for attaining global planarization in both large and small spaces, the need must apply to existing planarization processes. It would therefore be desirable to utilize existing planarization techniques, but with a focus upon achieving a more uniform interlevel dielectric upper surface prior to the planarization step. A more uniform dielectric upper surface which can be more readily planarized affords advantages of numerous levels of interconnect and thereby presents a more optimal multilevel interconnect structure. The interconnect structure and dielectric topographies must be equally applicable to either metal interlevel dielectric and polysilicon interlevel dielectric. Thus, an improved planarization process can be applied upon a dielectric upper surface arranged on the first level of interconnect (typically polysilicon) as well as subsequent levels (typically metal) to achieve an overall, globally planarized multilevel interconnect structure.

SUMMARY OF THE INVENTION

The problems outlined above are in large part solved by an improved multilevel interconnect structure. The interconnect structure is one having globally planarized metal or polysilicon interlevel dielectric. Accordingly, each interlevel dielectric is planarized in readiness for a subsequent interconnect level.

Planarization is achieved by placing non-operational conductors (either metal conductors or polysilicon conductors) in regions between select areas of operational conductors. The non-operational conductors are those which are not connected within the integrated circuit interconnect scheme, and are generally referred to as dummy conductors. The dummy conductors are designed not to carry current, or current which flows in the ordinary course of an integrated circuit function. The non-operational conductors are polysilicon conductors within the polysilicon level of interconnect, and are metal conductors within the metal level of interconnect. Converse to non-operational conductors, operational conductors are designed to connect active devices formed within the semiconductor substrate. The operational conductors thereby carry current associated with integrated circuit functionality, and thereby link select isolated devices to form the integrated circuit connections.

The non-operational conductors are spaced at regular intervals from each other and from nearby operational conductors. The non-operational and operational conductors are substantially co-planar to each other within an elevational level. Separation between non-operational and operational conductors is of minimum spacing—typically, the minimum conductor spacing associated with a manufacturer's layout guidelines. For example, metal conductors of 2.0 micron width may have a minimum spacing between 2.0 and 3.0 microns.

The present invention thereby contemplates a technique for manufacturing a photolithography mask. The mask comprises light opaque and light transmissive regions. Depending upon photoresist polarity, the light transmissive regions are transferred as operational and non-operational conductors upon a semiconductor topography. Alternatively, light opaque regions may be used to form conductors, depending upon the polarity of the photoresist. Formation of the light transmissive regions is carried forth by compiling target locations upon which it is desired for operational and non-operational conductors to exist across a semiconductor topography. Once the target locations are known, the transmissive regions can be formed within a mask, and the mask can thereafter be used to repetitively produce evenly spaced operational and non-operational conductors.

By inserting the non-operational conductors a minimum spaced distance from each other and from operational conductors, the interconnect level is optimally configured such that when a dielectric is deposited thereon, the interlevel dielectric does not contain large valley areas. Instead, the interlevel dielectric surface contains a repetitive pattern of small valley regions with minimal elevational disparities. The optimal interlevel dielectric surface resulting from the improved layout and conductor placement hereof can thereby be readily planarized using, for example, CMP.

Broadly speaking, the present invention contemplates, according to one embodiment, a method for producing a metal interconnect photolithography mask. Locations of metallic operational conductors relative to their position across a semiconductor topography are determined, and a space about the periphery of each of the operational conductors is defined. Locations of metallic non-operational conductors are then formulated by a predefined space from the operational conductors and also by a predefined space from each other across the semiconductor substrate. The non-operational conductors are defined as the same width as the operational conductors. Once locations of operational and non-operational conductors are determined, then a metal interconnect photolithography mask can be compiled and produced in accordance with light transmissive features (or possibly light opaque features) which are commensurate with the locations of the operational and non-operational conductors.

According to an alternative embodiment, a method is presented for producing a polysilicon interconnect photolithography mask. In this embodiment, the polysilicon photolithography mask is that which is used to simultaneously produce, for example, gate polysilicon, polysilicon capacitor dielectric, and/or polysilicon local interconnect. Similar to the method for producing a metal interconnect photolithography mask, a polysilicon interconnect photolithography mask is produced by transferring target (i.e., desired) regions of spaced non-operational polysilicon conductors and operational polysilicon conductors to a photolithography mask area. A difference exists, however, in that the polysilicon non-operational conductors are formed exclusive of active regions and only in field regions. The non-operational conductors cannot be formed in active regions since, to do so, would cause formation of active devices.

The present invention still further contemplates an integrated circuit. The integrated circuit comprises a series of operational conductors and a series of non-operational conductors. The operational conductors and non-operational conductors can be metallic or polysilicon, depending upon the elevational level being formed. The operational and non-operational conductors are uniformly spaced from each other across the semiconductor topography. A dielectric extends upon and between the operational and non-operational conductors, wherein the dielectric includes an upper topography of substantially uniform elevational level. The uniform elevational level is a result of the uniform spacing of conductors in the absence of relatively large valley regions.

BRIEF DESCRIPTION OF THE DRAWINGS

Other objects and advantages of the invention will become apparent upon reading the following detailed description and upon reference to the accompanying drawings in which.

Figure 1:
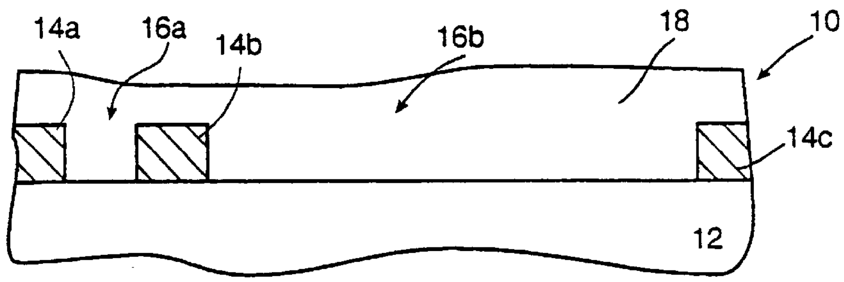
FIG. 1 is a partial cross-sectional view of a semiconductor topography having a dielectric placed upon and between closely spaced and densely spaced interconnect.
Figure 2:
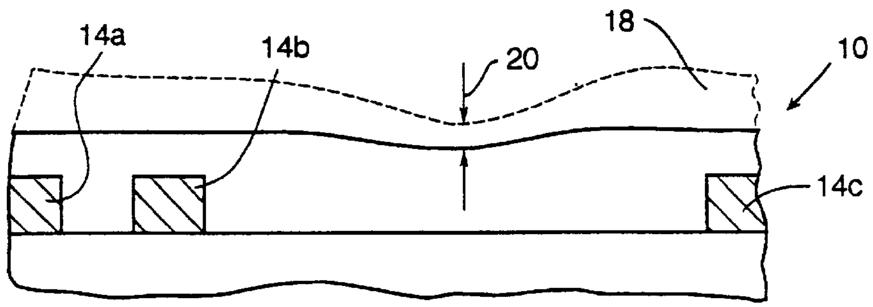
FIG. 2 is a processing step subsequent to that of FIG. 1, wherein the upper dielectric topography is conventionally removed to an uneven planarization level.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
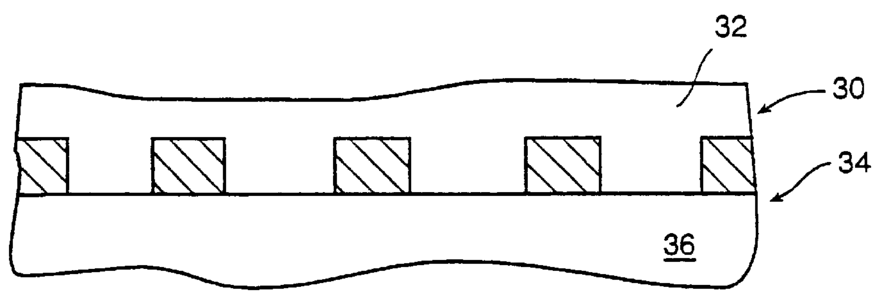
FIG. 3 is a partial cross-sectional view of a semiconductor topography with dielectric placed upon and between substantially evenly spaced interconnect according to one embodiment of the present invention.

Turning now to drawings, FIG. 3 illustrates a partial cross-sectional view of a semiconductor topography 30. Topography 30 includes an interlevel dielectric 32 placed upon and between evenly spaced interconnect 34. Interconnect 34 is pattern formed upon a topographical surface 36 according to lithography techniques. Surface 36 comprises either a dielectric formed upon a level of interconnect, or a dielectric formed upon a silicon substrate. Surface 36 is typically a dielectric-covered substrate if interconnect 34 comprises polysilicon. On the other hand, surface 36 comprises one or more levels of dielectric-covered interconnect if interconnect 34 comprises metal.

Figure 4:
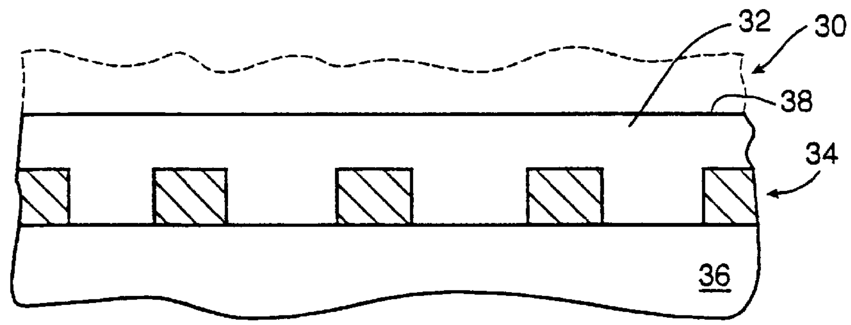
FIG. 4 is a processing step subsequent to FIG. 3, wherein the upper dielectric topography is removed to a globally even elevational level.

Interconnect 34 is arranged and formed as a singular level of interconnect, substantially co-planar to each other and comprising operational and non-operational conductors. Spacing between conductors which form interconnect 34 is, according to a present design, substantially uniform and of substantially minimum dimension, or slightly greater than minimum to reduce capacitance. FIG. 4 illustrates a subsequent step to that of FIG. 3, wherein the upper dielectric topography of dielectric 32 is removed to a globally even elevational level. The global planarization achieved by the present process is a result of evenly spaced interconnect 34. At the conclusion of the planarization sequence, possibly using either CMP or etchback, an interlevel dielectric surface 38 is formed as shown.

Figure 5:
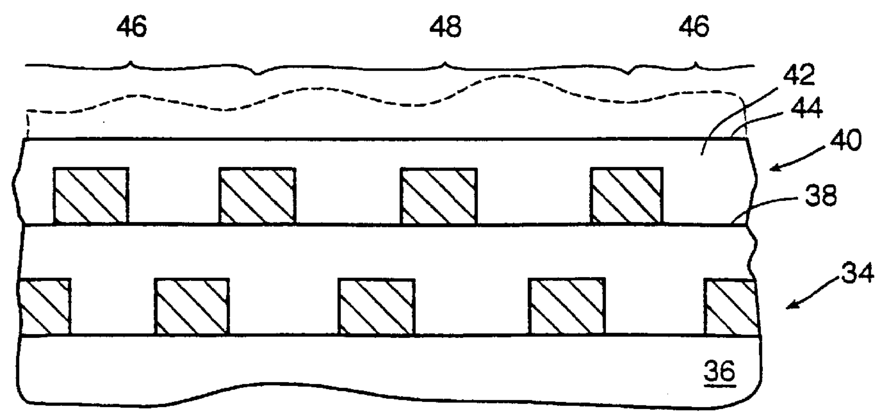
FIG. 5 is a partial cross-sectional view of a semiconductor topography having two levels of interconnect evenly spaced from each other for providing planarization enhancement to dielectric topography at each level.

FIG. 5 illustrates semiconductor topography 30 as having at least two levels of interconnect 34 and 40. Interconnect 40 is patterned upon planarized surface 38. Dielectric 42 is planarized similar to dielectric 32, to produce an upper surface 44. As shown, more than one level of interconnect, and typically more than two levels of interconnect 34 and 40 are produced, each having a interlevel dielectric upper surface which is globally planarized according to the optimal placement of non-operational conductors within interconnect 34 and 40. FIG. 5 further illustrates semiconductor topography 30 as having active regions 46 and field regions 48. Since active and field regions exist, the polysilicon conductors within first interconnect level 34 must be carefully placed and polysilicon non-operational conductors must be restricted to regions outside active regions 46.

Figure 6:
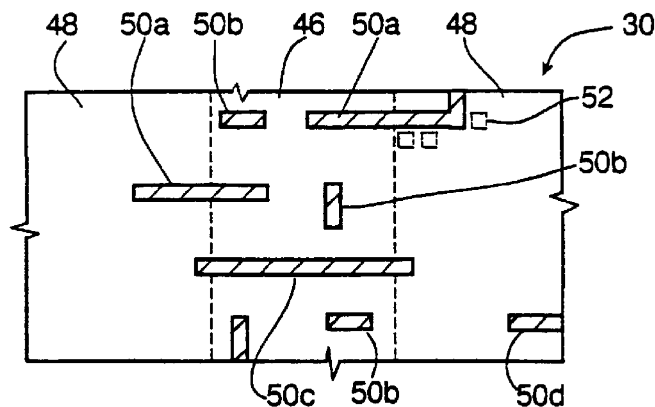
FIG. 6 is a partial top plan view of a first level of operational conductors (i.e., polysilicon conductors) formed within active and field regions of a semiconductor substrate.

FIGS. 6–9 illustrate the steps necessary for producing a polysilicon interconnect photolithography mask, according to one of many exemplary embodiments. Specifically, FIG. 6 illustrates a partial top plan view of a first level of operational conductors (i.e., polysilicon conductors) formed within an active and field regions 46 and 48, respectively, of semiconductor topography 30. Polysilicon operational conductors 50 can extend as polysilicon local interconnect 50*a*, as capacitor dielectric 50*b* or as gate polysilicon 50*c*. FIG. 6 illustrates examples of each type of polysilicon operational conductor 50 in active region 46, and also illustrates polysilicon operational conductor which might be formed in field region 46 as designated by reference numeral 50*d*. It is understood, however, that each active region may necessarily have only one type of polysilicon operational conductor. Or, depending upon the application, may contain more than one type of operational conductor. It is also understood that FIG. 6, for purpose of an example only, depicts three active area operational conductor types and a field region operational conductor. It is understood that more than the types shown may be considered as operational polysilicon conductors and serve as receptors for current flowing through a formed integrated circuit.

A space 52 of minimum square dimension is reserved about each operational conductor 50 to define areas reserved about the operational conductors and designated as oversized operational areas. The oversized operational areas are combined through an "OR" function with blanket field regions 54, shown in FIG. 7. The blanket field regions represent a layer of conductive material targeted for placement across only field regions 48 and not across active region 46. Thus, blanket field region 54 is a target location which is shown only for purposes of illustrating its combination with the oversized operational areas. Blanket field regions 54 are not necessarily placed on a semiconductor topography but are used to represent the logical combination necessary in forming a photolithography mask.

Figure 7:
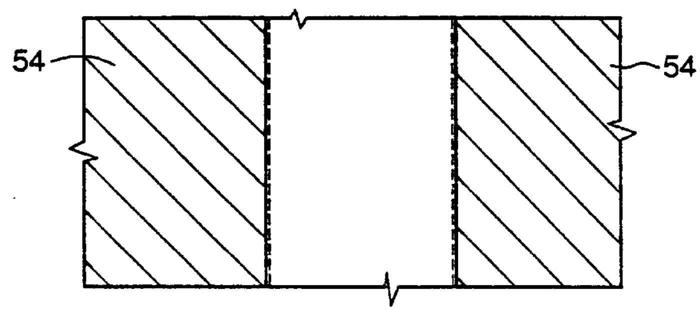
FIG. 7 is the partial top plan view of defined field regions only.
Figure 8:
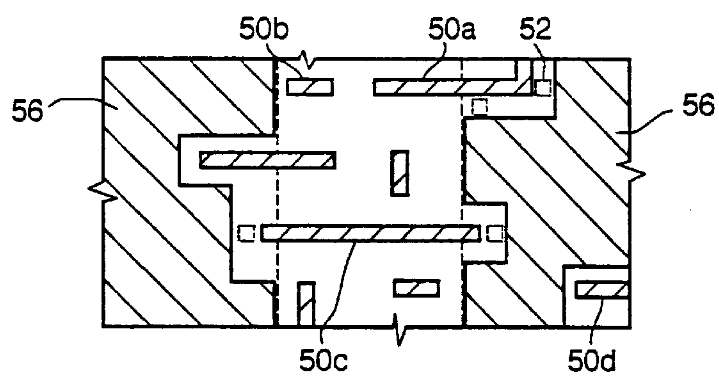
FIG. 8 is the partial top plan view of the first level operational conductors surrounded by a minimum space and combined with the field regions.

FIG. 8 represents the product of ORing the oversized operational areas in FIG. 6 with the blanket field regions 54 in FIG. 7. FIG. 8 depicts operational conductors 50 and what remains of blanket field region 54 after the ORing function. Minimum space 52 exists around operational conductors 50 only within field regions 48 to produce remaining field region 56.

Figure 9:
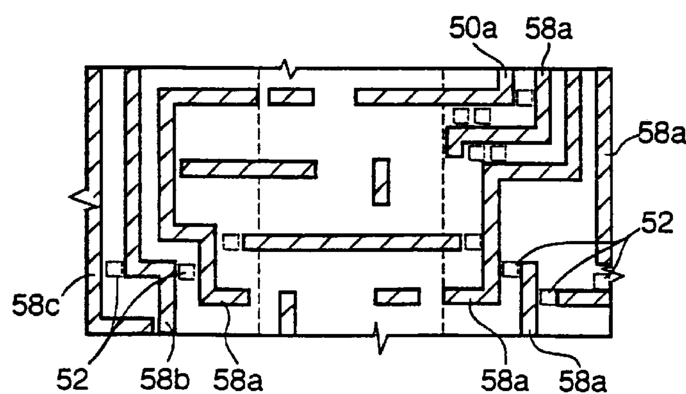
FIG. 9 is the partial top plan view of first level operational and first level non-operational conductors spaced at regular intervals across the field regions of the semiconductor substrate.

FIG. 9 depicts successive application of minimum space 52 to the remaining field region 56. Space 52 is applied in succession, wherein a first set of non-operational conductors **58*a* are produced a minimum space distance 52 away from operational conductors 50. Another set of non-operational conductors 58*b* are produced a minimum spaced distance 52 from first set of non-operational conductors 58*a*. A third set of non-operational conductors 58*c* are produced a spaced distance 52 from a second set of non-operational conductors 58*b*, and so on. Thus, the successive application of minimum space 52 is applied to produce numerous sets of successively formed non-operational conductors 58 all of remaining field region 56** is consumed.

FIGS. 6–9 illustrate a sequence by which locations for operational and non-operational conductors within a polysilicon interconnect level are determined. Given the relative locations of those conductors, opaque and transmissive regions can be determined, and the relative locations of those opaque and transmissive regions produced on a lithography mask. As defined herein, a lithography mask is one which may or may not contact a semiconductor topography. A lithography mask includes opaque and transmissive regions which block or forward ultraviolet light to a photosensitive layer placed over the semiconductor topography. Thus, the photosensitive layer is selectively removed allowing underlying, exposed conductive layer to be removed. Select removal of conductive layer fashions the operational and non-operational conductors. FIGS. 6–9 suffice to explain one way in which to derive the transmissive and opaque regions based on where those regions should be located within the mask or reticle, and the effect of the resulting mask or reticle upon the semiconductor topography. Accordingly, FIGS. 6–9 illustrate an algorithm by which a photolithography mask can be produced having the advantages of evenly spaced conductors. Evenly spaced conductors produce a globally planarized interlevel dielectric surface, as illustrated in FIGS. 3–5.

FIGS. 10–13 illustrate an algorithm or methodology by which a metal interconnect photolithography mask can be derived. While FIGS. 6–9 depict derivation of polysilicon interconnect mask, FIGS. 10–13 are unique to a metal mask. A metal mask is somewhat less complex than a polysilicon mask in that attention need not be paid to active and field regions. A non-operational metal conductor can extend across an active region without hindering operational devices therein.

Figure 10:
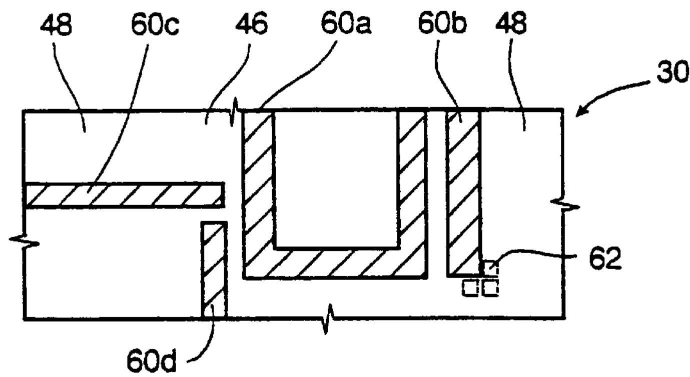
FIG. 10 is a partial top plan view of a set of a second level operational conductors (i.e., metal conductors) formed within active and field regions.
Figure 11:
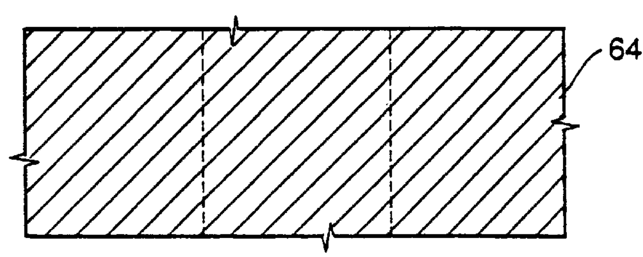
FIG. 11 is the partial top plan view of both field regions and active regions.

FIG. 10 is a partial top plan view of a set of second level operational conductors 60 (i.e., metal conductors) formed within active regions 46 as well as field regions 48. Active and field regions 46 and 48 extend across a semiconductor topography 30. In FIG. 10, four metal operational conductors **60*a*, 60*b*, 60*c*, and 60*d* are shown. Application of minimum space 62 about each metal operational conductor 60 causes the formation of a set of oversized operational areas which, when combined through an OR function with a blanket field and active region 64 (shown in FIG. 11), a result shown in FIG. 12** occurs.

Figure 12:
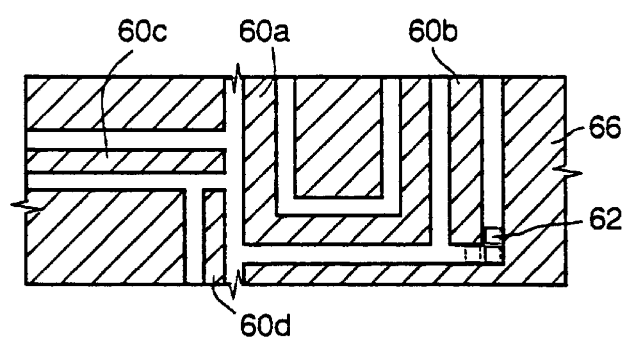
FIG. 12 is the partial top plan view of second level operational conductors surrounded by a minimum space and combined with the field and active regions.
Figure 13:
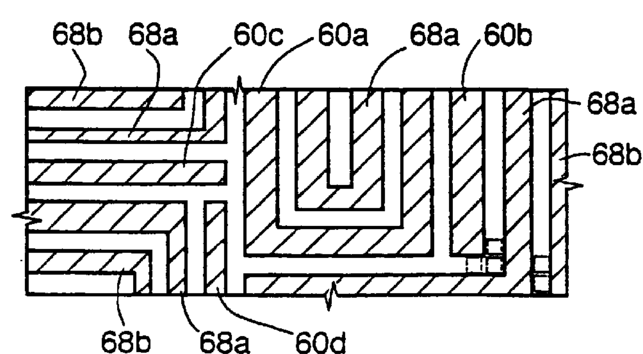
FIG. 13 is the partial top plan view of second level operational and second level non-operational conductors spaced at regular intervals across the field and active regions of the semiconductor substrate.

FIG. 12 illustrates metal operational conductors 60 spaced by minimum space 62 to what remains of blanket region 64. The remaining blanket region 64 is presented as reference numeral 66.

Successive application of minimum space 62, first to operational conductors 60 and then to first, second, etc., sets of non-operational conductors, produces non-operational conductors 68. Non-operational conductors are metal conductors labeled in the order in which they are produced: **68*a*, 68*b*, etc. Thus, FIGS. 10–13 illustrate successive application of a minimum spacing 62 to present metal non-operational conductors 68 relative to metal operational conductors 60**. The minimum spacing is defined as the minimum metal spacing associated with a manufacturer's layout design rules. The minimum spacing can vary depending upon the process, an examples of a typical minimal spacing is set forth above.

Figure 14:
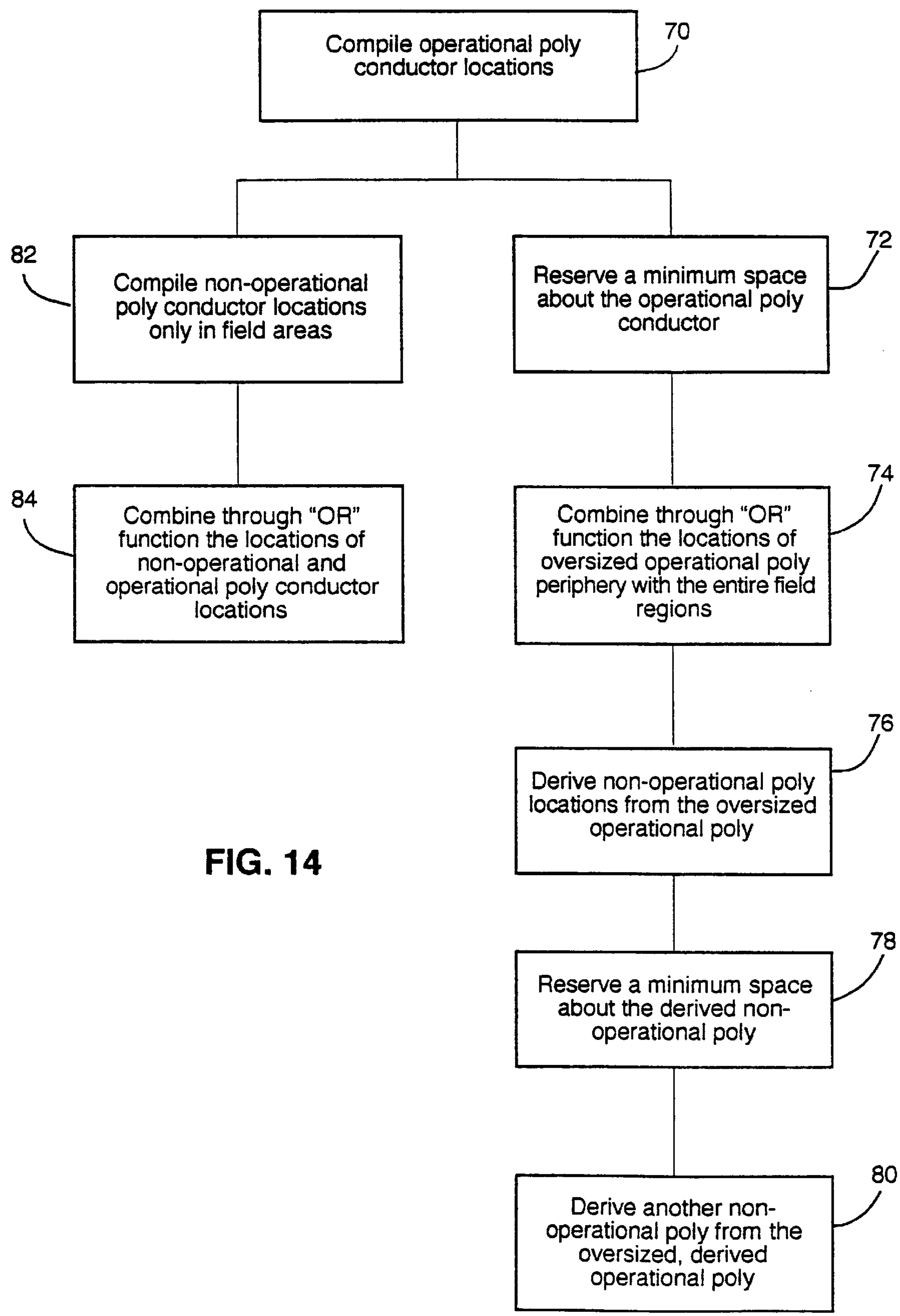
FIG. 14 is a flow diagram of two exemplary methodologies for deriving features to be placed upon a mask or reticle in accordance with formation of a set of second level operational and non-operational conductors upon an integrated circuit.

FIGS. 6–9 illustrate but one example of a way to formulate a polysilicon interconnect photolithography mask using the successive application of minimum spacing technique. FIG. 14, however, illustrates the flow sequence by which polysilicon operational and non-operational conductors are formed using either only the successive application of minimum spacing or another technique described below. A first step necessary in determining transmissive regions is to compile the operational polyconductor locations 70. It is understood that the operational conductor locations are target locations or desired locations which the photolithography mask will produce if derived according to the present invention. Using the successive application technique, a minimum space is reserved about the operational polysilicon conductor 72. Through an OR function, the locations of oversized operational polysilicon ("poly") periphery is combined with the entire field region but not the active region 74. Thereafter, non-operational poly locations are derived from the oversized operational poly, or reserved regions about the operational poly as shown by step 76. Step 76 is repeated in succession by thereafter again applying the minimum space about the first set of derived, non-operational poly to produce a second set of non-operational poly. The steps shown as reference numeral 78 and 80 can be repeated as many times as necessary to produce a full complement of non-operational poly within the field regions at regular spaced intervals from each other.

If the successive application of minimum spacing is not desired, other techniques for producing non-operational poly conductors from operational poly conductors can be performed. For example, FIG. 14 illustrates step 82, whereby a set of non-operational poly conductors extending across the entire field areas and not the active areas are compiled. Step 82 illustrates simultaneous compilation of those non-operational conductor locations to present a grid of polysilicon conductors extending across at least a portion of the field regions. In step 84, the non-operational poly conductors in step 82 are combined through an OR function with the locations of operational poly conductors previously determined in step 70.

FIG. 14 illustrates two of possibly numerous algorithms useful in producing operational and non-operational poly conductors. Steps shown in FIG. 14 can to some extent also be applied to production of operational and non-operational metal conductors. Regardless of the sequence of steps or the steps themselves, the outcome should always remain the same: to produce readily spaced conductors across the semiconductor topography such that an interlevel dielectric can be globally planarized.

It will be appreciated to those skilled in the art having the benefit of this disclosure that this invention is capable of applications with numerous types of MOS-processed circuits. Furthermore, it is to be understood that the form of the invention shown and described is to be taken as presently preferred embodiments. Various modifications and changes may be made to each and every mask derivation step as would be obvious to a person skilled in the art having the benefit of this disclosure. It is intended that the following claims be interpreted to embrace all such modifications and changes and, accordingly, specification and drawings are regarded in an illustrative rather than a restrictive sense.

What is claimed is:

1. An integrated circuit, comprising:

a set of operational conductors, wherein oversized operational areas are defined at substantially a first spaced distance around each operational conductor of said set of operational conductors;

a first set of non-operational conductors, wherein each of said oversized operational areas is substantially continually adjacent to an operational conductor or a non-operational conductor, and wherein each of said oversized operational areas is adjacent to a non-operational conductor of said first set of non-operational conductors;

a second set of non-operational conductors, wherein first oversized non-operational areas are defined at substantially a second spaced distance around each non-operational conductor of said first set of non-operational conductors, and wherein each said first oversized non-operational area is substantially continually adjacent to an operational conductor or an non-operational conductor of said second set of non-operational conductors, and wherein each of said first oversized non-operational areas is adjacent to a non-operational conductor of said second set of non-operational conductors; and a third set of non-operational conductors, wherein second oversized non-operational areas are defined at substantially a third spaced distance around each non-operational conductor of said second set of non-operational conductors, and wherein each said second oversized non-operational area is substantially continually adjacent to an non-operational conductor of said first set of non-operational conductors or an non-operational conductor of said third set of non-operational conductors, and wherein each of said second oversized non-operational areas is adjacent to a non-operational conductor of said third set of non-operational conductors.

2. The integrated circuit of claim 1, wherein operational conductors of said set of operational conductors and non-operational conductors of said first set of non-operational conductors comprise metal.

3. The integrated circuit of claim 1, wherein said set of operational conductors and said first set of non-operational conductors are arranged within substantially the same level.

4. The integrated circuit of claim 1, wherein said set of operational conductors and said first set of non-operation conductors are arranged upon a dielectric surface.

5. The integrated circuit of claim 1, wherein operational conductors of said set of operational conductors and non-operational conductors of said first set of non-operational conductors comprise a substantially uniform lateral width, and wherein said first, second, and third spaced distances are each less than three times said substantially uniform lateral width.

6. The integrated circuit of claim 1, wherein operational conductors of said set of operational conductors and non-operational conductors of said first set of non-operational conductors comprise a substantially uniform lateral width, and wherein said first, second, and third spaced distances are each less than two times said substantially uniform lateral width.

7. The integrated circuit of claim 1, wherein operational conductors of said set of operational conductors and non-operational conductors of said first set of non-operational conductors comprise a substantially uniform lateral width, and wherein said first, second, and third spaced distances are each less than said substantially uniform lateral width.

8. An integrated circuit, comprising:

a set of operational conductors, wherein oversized operational areas are defined at substantially a first spaced distance around each operational conductor of said set of operational conductors; and a first set of non-operational conductors, wherein each said oversized operational area is substantially continually adjacent to an operational conductor or a non-operational conductor, and wherein each of said oversized operational areas is adjacent to a non-operational conductor of said first set of non-operational conductors, and wherein said first set of non-operational conductors is contained within a field region of said integrated circuit, and wherein operational conductors of said set of operational conductors and non-operational conductors of said first set of non-operational conductors comprise a substantially uniform lateral width, and wherein said first spaced distance is less than three times said substantially uniform lateral width.

9. The integrated circuit of claim 8, further comprising a second set of non-operational conductors contained within a field region of said integrated circuit, wherein first oversized non-operational areas are defined at substantially a second spaced distance around each non-operational conductor of said first set of non-operational conductors, and wherein each said first oversized non-operational area is substantially continually adjacent to an operational conductor or an non-operational conductor of said second set of non-operational conductors, and wherein each of said first oversized non-operational areas is adjacent to a non-operational conductor of said second set of non-operational conductors.

10. The integrated circuit of claim 9, further comprising a third set of non-operational conductors contained within a field region of said integrated circuit, wherein second oversized non-operational areas are defined at substantially a third spaced distance around each non-operational conductor of said second set of non-operational conductors, and wherein each said second oversized non-operational area is substantially continually adjacent to an non-operational conductor of said first set of non-operational conductors or an non-operational conductor of said third set of non-operational conductors, and wherein each of said second oversized non-operational areas is adjacent to a non-operational conductor of said third set of non-operational conductors.

11. The integrated circuit of claim 8, wherein operational conductors of said set of operational conductors and non-operational conductors of said first set of non-operational conductors comprise polysilicon.

12. The integrated circuit of claim 8, wherein said set of operational conductors and said first set of non-operational conductors are arranged within substantially the same level.

13. The integrated circuit of claim 8, wherein said set of operational conductors and said first set of non-operation conductors are arranged upon a dielectric surface.

14. The integrated circuit of claim 8, wherein said first spaced distance is less than two times said substantially uniform lateral width.

15. The integrated circuit of claim 8, wherein said first spaced distance is less than said substantially uniform lateral width.

* * * * *